(12) United States Patent
Nishikawa et al.

(10) Patent No.: US 9,741,838 B2
(45) Date of Patent: Aug. 22, 2017

(54) SEMICONDUCTOR DEVICE

(71) Applicant: KABUSHIKI KAISHA TOSHIBA, Tokyo (JP)

(72) Inventors: Yukie Nishikawa, Nonoichi Ishikawa (JP); Masaki Okazaki, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/240,825

(22) Filed: Aug. 18, 2016

(65) Prior Publication Data

US 2017/0213902 A1 Jul. 27, 2017

(30) Foreign Application Priority Data

Jan. 27, 2016 (JP) .................................. 2016-013553

(51) Int. Cl.
| | |
|---|---|
| *H01L 29/76* | (2006.01) |
| *H01L 29/739* | (2006.01) |
| *H01L 29/423* | (2006.01) |
| *H01L 29/06* | (2006.01) |

(52) U.S. Cl.
CPC ...... *H01L 29/7397* (2013.01); *H01L 29/0696* (2013.01); *H01L 29/4236* (2013.01); *H01L 29/4238* (2013.01); *H01L 29/42376* (2013.01)

(58) Field of Classification Search
CPC .................. H01L 29/7393; H01L 2924/13055
See application file for complete search history.

(56) References Cited

U.S. PATENT DOCUMENTS

| | | | | | |
|---|---|---|---|---|---|
| 5,468,982 | A | * | 11/1995 | Hshieh | ................ H01L 29/0696 257/331 |
| 5,998,837 | A | * | 12/1999 | Williams | ............ H01L 27/0255 257/328 |
| 7,091,554 | B2 | * | 8/2006 | Muraoka | ............. H01L 29/0839 257/330 |
| 9,496,382 | B2 | * | 11/2016 | Li | ..................... H01L 21/76802 |

FOREIGN PATENT DOCUMENTS

| | | |
|---|---|---|
| JP | H10256545 A | 9/1998 |
| JP | 2004055968 A | 2/2004 |
| JP | 2004-200540 A | 7/2004 |
| JP | 2009224734 A | 10/2009 |

* cited by examiner

*Primary Examiner* — Jaehwan Oh

(74) *Attorney, Agent, or Firm* — Patterson & Sheridan, LLP

(57) ABSTRACT

A semiconductor device includes a plurality of gate electrodes. Each gate electrode includes a first portion extending from a first end to a second end and a second portion extending parallel the first portion from a first end to a second end. The first and second portions are spaced from each other. A third portion of at least one gate electrode connects the first end of the first portion to the first end of the second portion of the gate electrode. A first insulating film is on the plurality of gate electrodes. A first interconnect portion is disposed on the first or second portion the gate electrode to electrically connecting the gate electrode to a gate pad. A second interconnect portion is disposed on semiconductor regions between the gate electrodes and electrically connects the semiconductor regions to an emitter pad.

20 Claims, 15 Drawing Sheets

SEMICONDUCTOR DEVICE

CROSS-REFERENCE TO RELATED APPLICATION

This application is based upon and claims the benefit of priority from Japanese Patent Application No. 2016-013553, filed Jan. 27, 2016, the entire contents of which are incorporated herein by reference.

FIELD

Embodiments described herein relate generally to a semiconductor device.

BACKGROUND

Semiconductor devices such as an insulated gate bipolar transistor (IGBT) are widely used for a use such as power conversion. In the semiconductor devices, it is required for a gate electrode to have high reliability.

DETAILED DESCRIPTION

Figure 1:
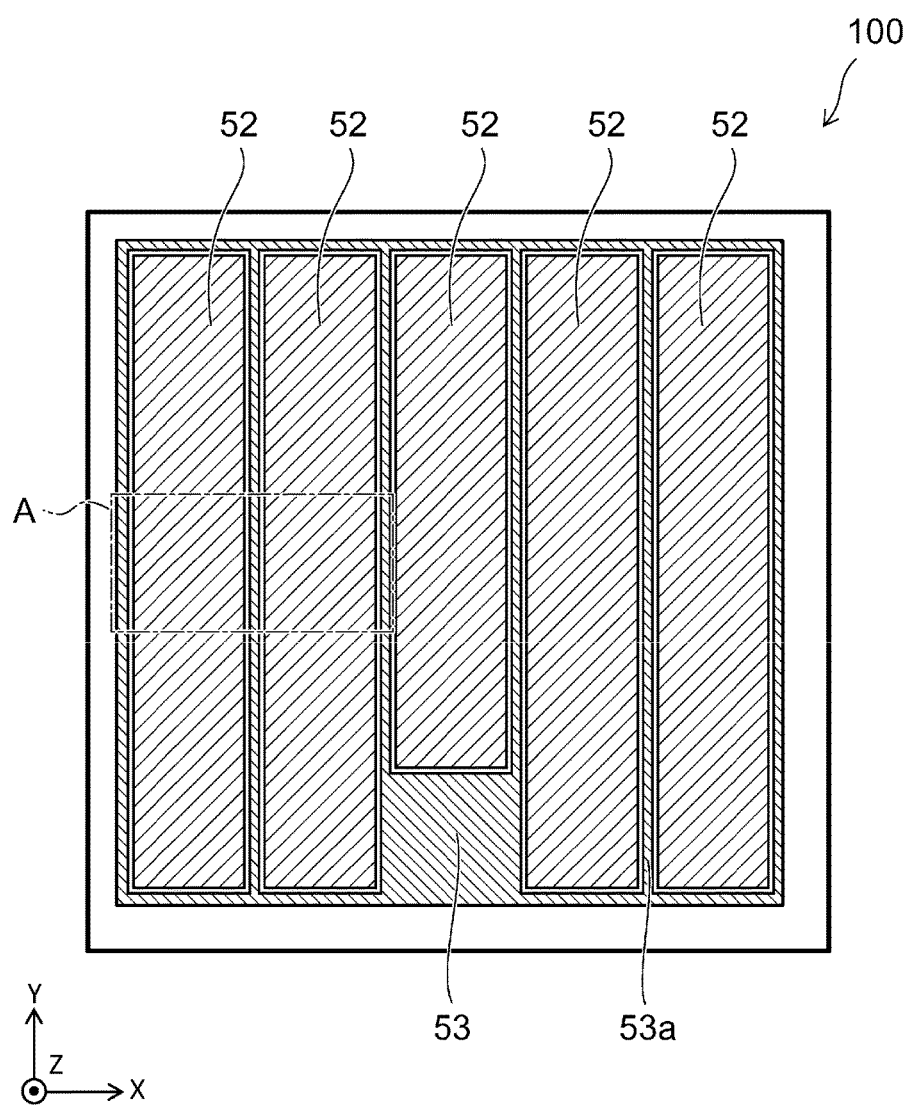
FIG. 1 is a plan view of a semiconductor device according to a first embodiment.

In general, according to one embodiment, a semiconductor device includes a first semiconductor region of a first conductivity type, a second semiconductor region of a second conductivity type on the first semiconductor region, and a third semiconductor region of the first conductivity type on the second semiconductor region such that the second semiconductor region is between first and third region in a first direction. A plurality of gate electrodes are on the second semiconductor region and extend through the third semiconductor region in the first direction. The plurality of gate electrodes extend in a second direction and are spaced from each other in a third direction. The second and third directions cross each other and are parallel to a plane of the first semiconductor region. The first direction extends away from the plane. A fourth semiconductor region of the second conductivity type is disposed on the third semiconductor region. A concentration of second conductivity type impurities in the fourth semiconductor region is greater than a concentration of second conductivity type impurities in the second semiconductor region. A fifth semiconductor region of the first conductivity type is disposed on the third semiconductor region and is adjacent to the fourth semiconductor region in the second direction. A concentration of first conductivity type impurities in the fifth semiconductor region is greater than a concentration of first conductivity type impurities in the third semiconductor region. Each gate electrode includes: a first portion extending in the second direction from a first end to a second end; a second portion extending in the second direction from a first end to a second end, the first and second portions being spaced from each other in the third direction; and a third portion extending in the first direction. The third portion connects the first end of the first portion to the first end of the second portion. The third portion is in a portion of the second semiconductor region. The first and second portions are in the third, fourth, and fifth semiconductor regions. A first insulating film is on the plurality of gate electrodes and the second, third, fourth, and fifth semiconductor region. A first interconnect portion is disposed on the first or second portion of at least one gate electrode in the plurality of gate electrodes and extends in the first direction through the first insulating film to electrically connect the gate electrode to a gate pad. A second interconnect portion is disposed on the fourth and fifth semiconductor regions and extends in the first direction through the first insulating film to electrically connect the fourth and fifth semiconductor regions to an emitter pad.

Hereinafter, example embodiments will be described with reference to the accompanying drawings. The drawings are schematic or conceptual, and depicted thicknesses and widths of portions, size ratios between the portions, and the like are not necessarily equal to those in actuality. In addition, dimensions or ratios of the same portion/element may be illustrated differently in different drawings.

In addition, in this specification, and the drawings, the same reference numeral will be given to the same element depicted in different drawings and once described further description of such an element may be omitted.

In description of various example embodiments, an XYZ orthogonal coordinate system is used. A direction from a $p^+$-type collector region 1 to an $n^-$-type semiconductor region 2 is set as a Z direction (first direction). Two directions which are perpendicular to the Z direction and are perpendicular to each other are set as an X-direction (second direction) and a Y direction (third direction), respectively.

In the following description, notations of "$n^+$", "$n^-$", "$p^+$", and "p" represent relative magnitudes of impurity concentrations of respective conductivity types. That is, a notation attached with "+" represents that an impurity concentration is relatively higher in comparison to a notation to which "+" is not attached, and a notation attached with "−" represents that an impurity concentration is relatively lower in comparison to a notation to which "−" is not attached.

In the following embodiments, the respective embodiments may also be executed by inverting a p-type and an n-type of respective semiconductor regions.

First Embodiment

An example of a semiconductor device according to a first embodiment will be described with reference to FIG. 1 to FIG. 5.

Figure 2:
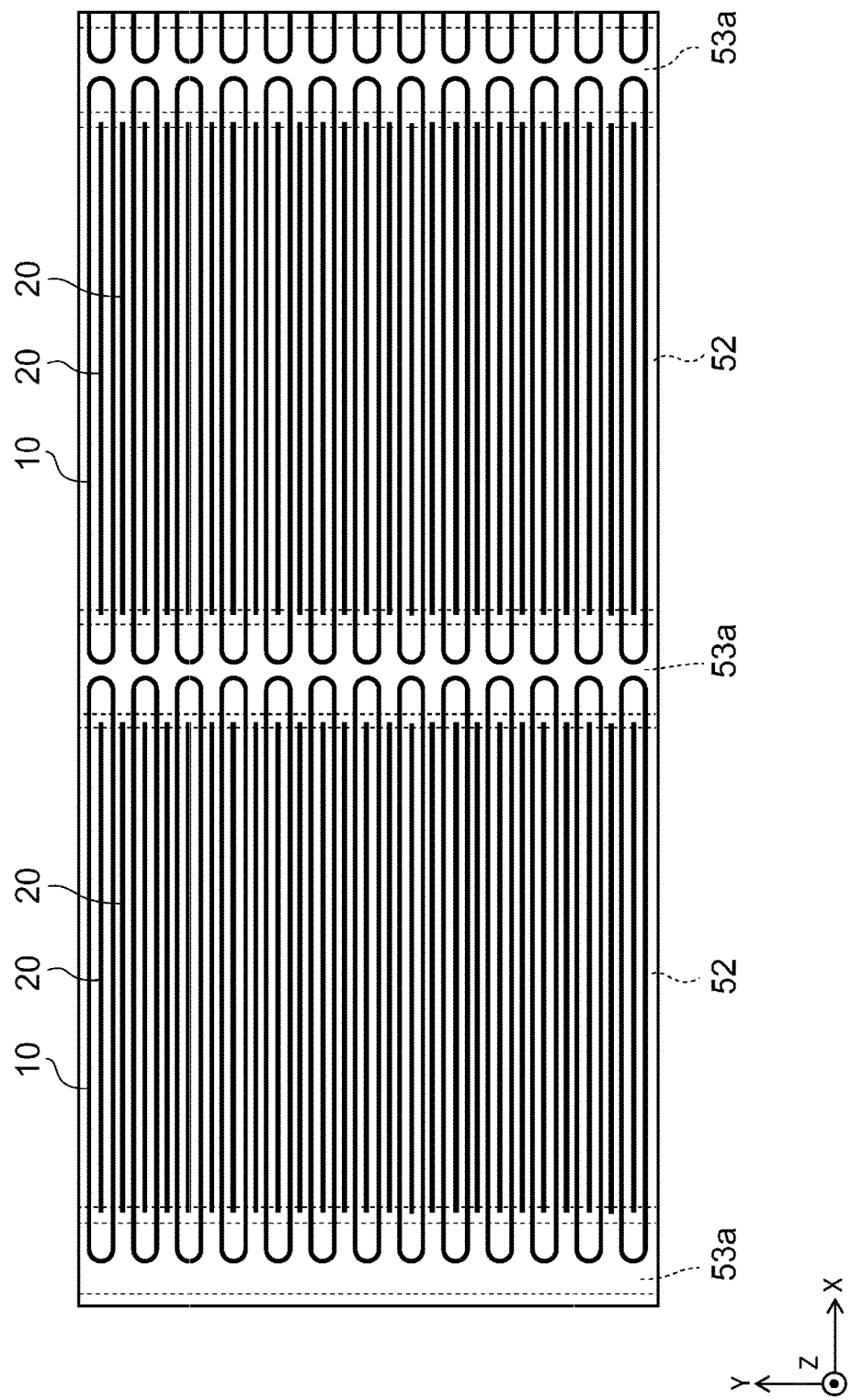
FIG. 2 is an enlarged plan view of a portion A from FIG. 1.
Figure 3:
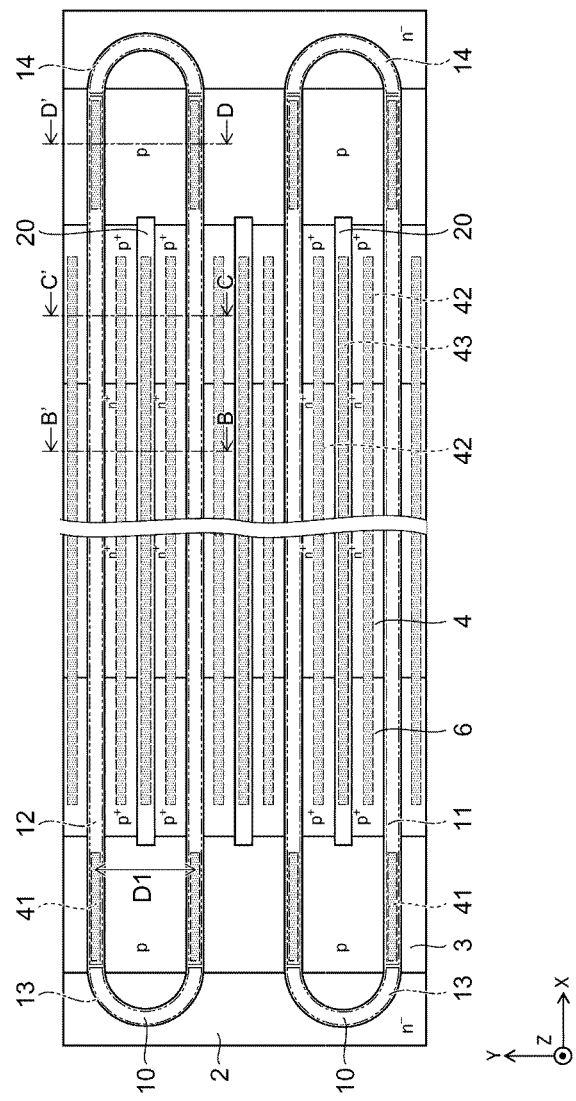
FIG. 3 is a partially enlarged plan view of FIG. 2.
Figure 4A:
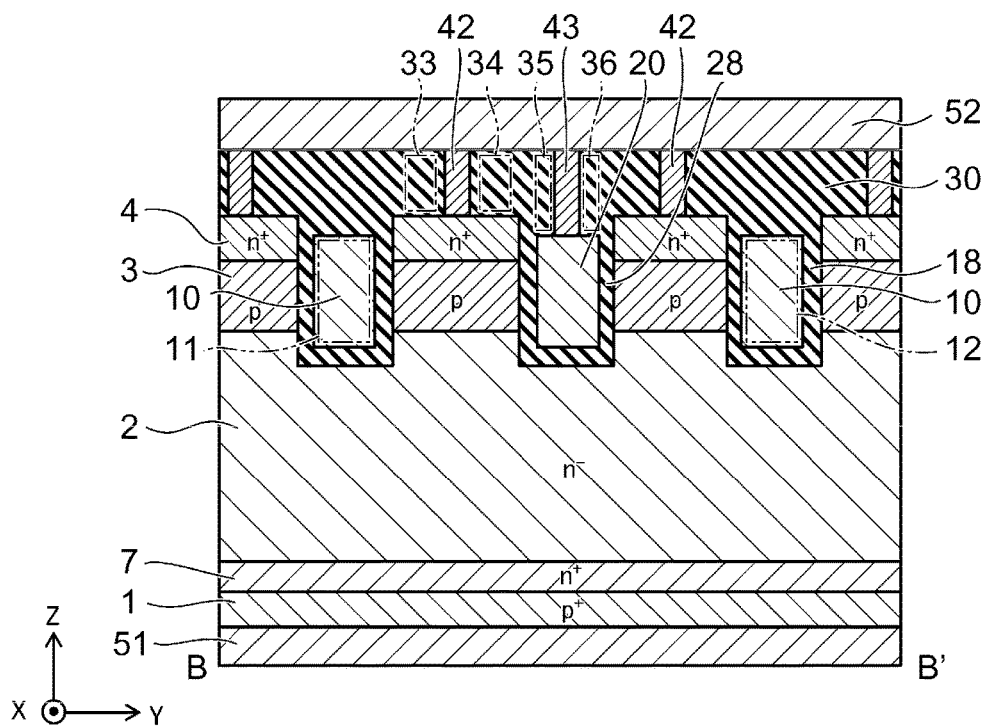
FIG. 4A is a cross-sectional view taken along line B-B' in FIG. 3.
Figure 4B:
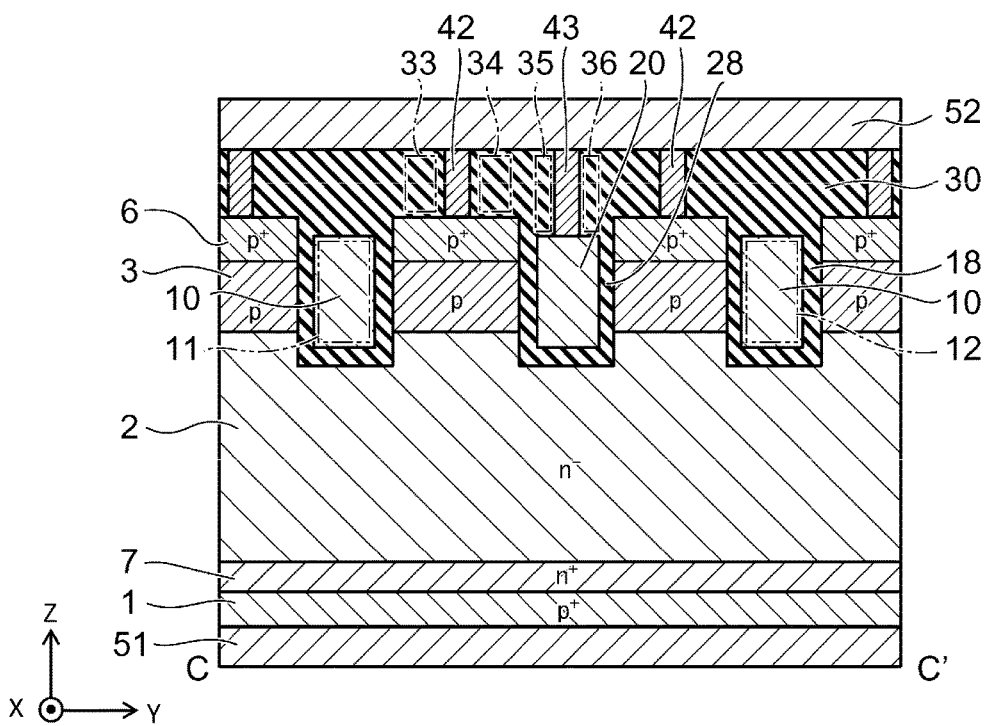
FIG. 4B is a cross-sectional view taken along line C-C' in FIG. 3.
Figure 5:
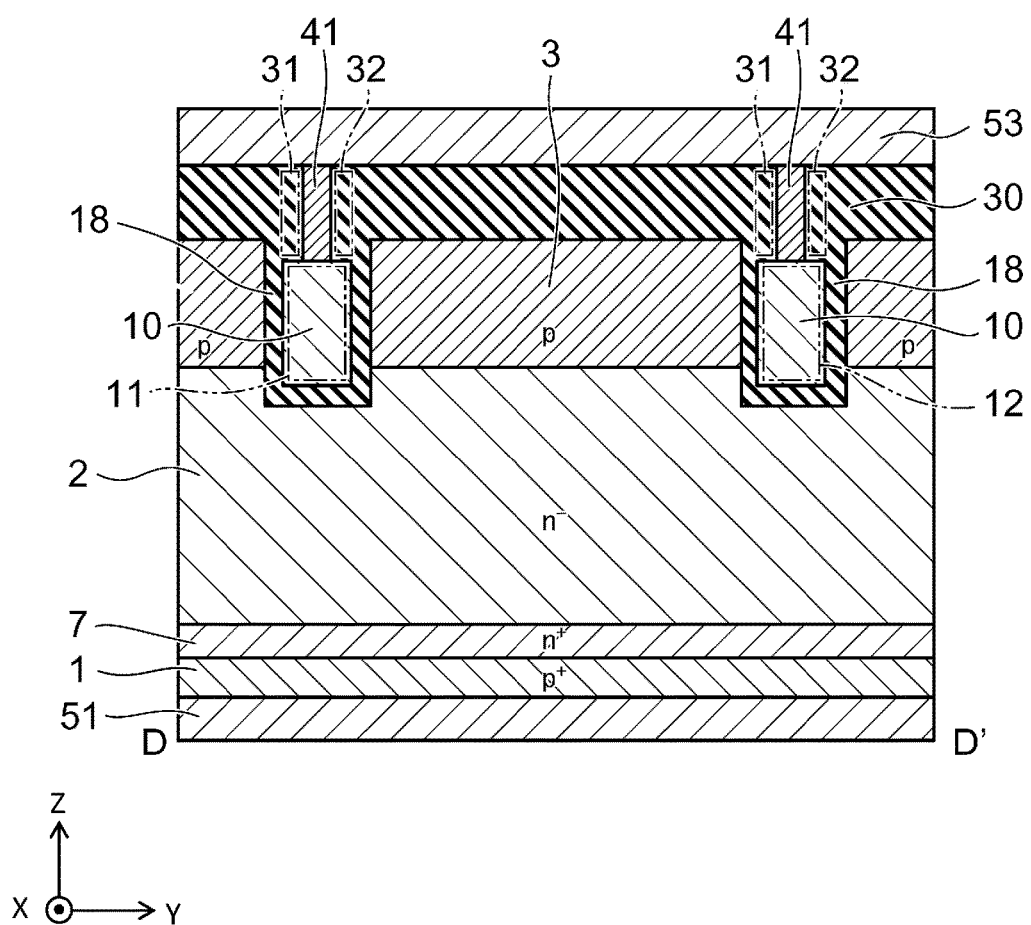
FIG. 5 is a cross-sectional view taken along line D-D' in FIG. 3.

FIG. 1 is a plan view of a semiconductor device 100 according to the first embodiment. FIG. 2 is an enlarged plan view of a portion A in FIG. 1. FIG. 3 is a partially enlarged plan view of FIG. 2. FIG. 4A is a cross-sectional view taken along line B-B' in FIG. 3, and FIG. 4B is a cross-sectional view taken along line C-C' in FIG. 3. FIG. 5 is a cross-sectional view taken along line D-D' in FIG. 3.

In FIG. 2, portions of certain elements are omitted for explanatory convenience, and an emitter pad 52 and an extension portion 53a of a gate pad 53 are indicated by a broken line. In FIG. 3, portions of certain elements are omitted, and plugs 41 to 43 are indicated by a broken line.

As non-limiting example, the semiconductor device 100 can be an IGBT.

As illustrated in FIG. 1 to FIG. 5, the semiconductor device 100 includes a $p^+$-type (first-conductivity-type) collector region 1 (first semiconductor region), an $n^+$-type (second-conductivity-type) semiconductor region 7, an $n^-$-type semiconductor region 2 (second semiconductor region), a p-type base region 3 (third semiconductor region), an $n^+$-type emitter region 4 (fourth semiconductor region), a $p^+$-type contact region 6 (sixth semiconductor region), a gate electrode 10, a gate insulation layer 18, an electrode 20, an insulating layer 28, an insulating layer 30 (first insulating layer), a plug 41 (first conductive portion), a plug 42 (second conductive portion), a plug 43, a collector electrode 51, an emitter pad 52 (second electrode), and a gate pad 53 (first electrode).

As illustrated in FIG. 1, the emitter pad 52 and the gate pad 53 are provided in an upper surface of the semiconductor device 100 and are spaced apart from each other. In addition, the gate pad 53 includes a plurality of extension portions 53a which extends in a Y direction, and the emitter pad 52 is provided between the extension portions 53a in an X direction.

As illustrated in FIG. 2, a plurality of gate electrodes 10 and a plurality of electrodes 20 are provided below the emitter pad 52 and the gate pad 53. In an example illustrated in FIG. 2, the plurality of gate electrodes 10 and the plurality of electrodes 20 are below the emitter pad 52 (Z direction) and arranged with respect to each other along the Y direction and extend longitudinally in the X direction.

The gate electrodes 10 have an annular shape in the X-Y plane and have semicircular shape at each end in the X direction. The gate electrodes 10 may be referred to in this context as having a "race track" shape or an "obround" shape. Some of the electrodes 20 are surrounded by the gate electrodes 10, and some of the electrodes 20 are between adjacent gate electrodes 10 in the Y direction. That is, some portion of the plurality of electrodes 20 consists of electrodes 20 that are disposed inside of the obround shape formed by a gate electrode 10, and another portion of the plurality of electrodes 20 consists of electrodes 20 that are disposed in a space between adjacent gate electrode 10 obround or racetrack shapes.

The plug 43 (see FIG. 3) is provided between (Z direction) the emitter pad 52 and each of the electrodes 20, and the emitter pad 52 and the electrode 20 are electrically connected to each other by the plug 43. Similarly, the plug 41 (see FIG. 3) is also provided between (Z-direction) the gate pad 53 and each of the gate electrodes 10, and the gate pad 53 and the gate electrode 10 are electrically connected to each other by the plug 41.

As illustrated in FIG. 3, the gate electrode 10 includes a first electrode portion 11, a second electrode portion 12, a third electrode portion 13, and a fourth electrode portion 14. The first electrode portion 11 and the second electrode portion 12 extend in the X direction, and are spaced apart from each other in the Y direction. The third electrode portion 13 is connected to the ends of the first electrode portion 11 and the second electrode portion 12 on one side of the gate electrode 10 in the X direction. The fourth electrode portion 14 is connected to the ends of the first electrode portion 11 and the second electrode portion 12 on the other side of the gate electrode 10 in the X direction from the third gate electrode portion 13. The third electrode portion 13 and the fourth electrode portion 14 are curved between the gate electrode portions, having a relatively gentle curvature, and are depicted as having a semicircular shape.

The plug 41 is connected at the ends (X direction ends) of the first electrode portion 11 and the second electrode portion 12. The third electrode portion 13 and the fourth electrode portion 14 are covered (Z direction) with the insulating layer 30, and the plug 41 is not provided over those electrode portions (13 and 14).

The $n^+$-emitter region 4 and the $p^+$-type contact region 6 are provided between the first electrode portion 11 and the electrode 20, and between the second electrode portion 12 and the electrode 20 in the Y direction. In addition, the $n^+$-type emitter region 4 and the $p^+$-type contact region 6 are alternately arranged along the X direction.

The plug 42 extends along the X direction and is connected to at least one $n^+$-type emitter region 4 and at least one $p^+$-type contact region 6 which are arranged in the X direction. As depicted in FIG. 3, each of the $n^+$-type emitter regions 4 and each of the $p^+$-type contact regions 6 are electrically connected to the emitter pad 52 through the plug 42.

Alternatively, a plurality of plugs 42 (or separate portions of a plug 42) may be arranged along the X direction but spaced apart from each other in the X direction, and the plugs 42 (or the separate portions) may each be connected to one of the $n^+$-type emitter regions 4 and one of the $p^+$-type contact regions 6.

Similarly, with regard to the plug 43, a plurality of plugs 43 (or separate portions of a plug 43), which are arranged along the X direction, may be connected to one electrode 20.

In the example illustrated in FIGS. 1 to 3, each plug 42 and plug 43 at a position along the X direction that is between the X direction position of the plugs 41 on the ends of the gate electrodes 10.

As illustrated in FIG. 4 and FIG. 5, a collector electrode 51 is provided on a lower surface of the semiconductor device 100.

The $p^+$-type collector region 1 is provided on the collector electrode 51, and is electrically connected to the collector electrode 51.

The $n^+$-type semiconductor region 7 is provided on the $p^+$-type collector region 1.

The $n^-$-type semiconductor region 2 is provided on the $n^+$-type semiconductor region 7.

The gate electrode 10 is provided on the $n^-$-type semiconductor region 2 but separated from the $n^-$-type semiconductor region 2 by the gate insulation layer 18.

The electrode 20 is provided on the $n^-$-type semiconductor region 2 but separated from the $n^-$-type semiconductor region 2 by the insulating layer 28. The gate electrode 10 and the electrode 20 are spaced apart from each other in the Y direction. In some embodiments, the gate insulation layer 18 and the insulating layer 28 may be different portions of the same film or material, or they may be or comprise distinct films or materials.

The p-type base region 3 is provided on the n$^-$-type semiconductor region 2 and between the first electrode portion 11 and the electrode 20, and between the second electrode portion 12 and the electrode 20.

The n$^+$-type emitter region 4 and the p$^+$-type contact region 6 are selectively provided on the p-type base region 3. That is, n$^+$-type emitter region 4 and the p$^+$-type contact region 6 are respectively provided only on certain portions of the p-type base region 3 rather than being each being disposed to cover the entirety of the p-type base region 3.

The insulating layer 30 is provided on the n$^+$-type emitter region 4, the p$^+$-type contact region 6, the gate electrode 10, and the electrode 20.

The emitter pad 52 and the gate pad 53 are provided on the insulating layer 30.

The plugs 41 to 43 extend through the insulating layer 30 in the Z direction.

Here, the vicinity of the plugs 41 to 43 will be described in more detail.

As illustrated in FIG. 4 and FIG. 5, the insulating layer 30 includes a first insulating portion 31, a second insulating portion 32, a third insulating portion 33, a fourth insulating portion 34, a fifth insulating portion 35, and a sixth insulating portion 36.

As illustrated in FIG. 5, each of the first insulating portions 31 is provided on one side of the first electrode portion 11 and the second electrode portion 12 in the Y direction.

Each of a plurality of the second insulating portions 32 is provided on the other side of the first electrode portion 11 and the second electrode portion 12 in the Y direction opposite the first insulating portion 31.

Each of the plugs 41 is provided on a portion of the first electrode portion 11 or on a portion of the second electrode portion 12, and is located between the first insulating portion 31 and the second insulating portion 32 in the Y direction.

As illustrated in FIG. 4A and FIG. 4B, the third insulating portions 33 on the n$^+$-type emitter regions 4 and the p$^+$-type contact regions 6 on one side (in the Y direction) of the plug 42. The fourth insulating portion 34 is on the n$^+$-type emitter regions 4 and the p$^+$-type contact regions 6 on the other side (in the Y direction) of the plug 42, opposite the third insulating portion 33. That is, the plug 42 between the third insulating portion 33 and the fourth insulating portion 34 in the Y direction.

The fifth insulating portion 35 is provided above the electrode 20 in on one side (in the Y direction) of the plug 43, and the sixth insulating portion 36 is provided on above electrode 20 on the other side (in the Y direction) of the plug 43, opposite the fifth insulating portion. That is, the plug 43 is between the fifth insulating portion 35 and the sixth insulating portion 36 in the Y direction.

Here, description will be given for example materials for each constituent element.

The p$^+$-type collector region 1, the n$^-$-type semiconductor region 2, the p-type base region 3, the n$^+$-type emitter region 4, the p$^+$-type contact region 6, and the n$^+$-type semiconductor region 7 may contain silicon, silicon carbide, gallium nitride, gallium aluminum nitride, gallium indium nitride, indium phosphide, or gallium arsenide as a semiconductor material.

As an n-type impurity that is added to the semiconductor material, arsenic, phosphorus, selenium, sulfur, silicon, antimony, and the like can be used. As a p-type impurity, boron, carbon, zinc, magnesium, and the like can be used.

The gate electrode 10 and the electrode 20 contain a conductive material such as polysilicon.

The gate insulation layer 18, the insulating layer 28, and the insulating layer 30 may comprise an insulating material such as silicon oxide and silicon nitride.

The plugs 41 to 43 may comprise a metal such as titanium or tungsten.

The collector electrode 51, the emitter pad 52, and the gate pad 53 may comprise a metal such as aluminum and nickel.

Next, description will be given of an example of a method of manufacturing the semiconductor device 100 according to the first embodiment with reference to FIG. 6 and FIG. 7.

FIGS. 6A to 7B are cross-sectional views illustrating processes in the manufacturing of the semiconductor device 100 according to the first embodiment.

In FIGS. 6A to 7B, a left-hand side (on page left) illustrates a manufacturing process with respect to a position corresponding to that which line B-B' in FIG. 3 depicts, and a right-hand side (on page right) illustrates a manufacturing process with respect to a position corresponding to that which line D-D' in FIG. 3 depicts.

In an initial process, a semiconductor substrate including an n$^-$-type semiconductor layer 2a is prepared or otherwise obtained. Next, ion implantation of a p-type impurity is performed with respect to a surface of the n$^-$-type semiconductor layer 2a to form the p-type base region 3. Next, a plurality of openings OP1, which reach the n$^-$-type semiconductor layer 2a through the p-type base region 3, are formed. The openings OP1 extend along the X direction. As an example, a pitch of the plurality of openings OP1 is 2.0 μm. More specifically, the dimension of the openings OP1 in the Y direction is approximately 1.0 μm, and a gap/spacing between the openings OP1 in the Y direction is approximately 1.0 μm. In addition, the depth (a dimension along the Z direction) of the openings OP1 is 5.5 μm.

Figure 6A:
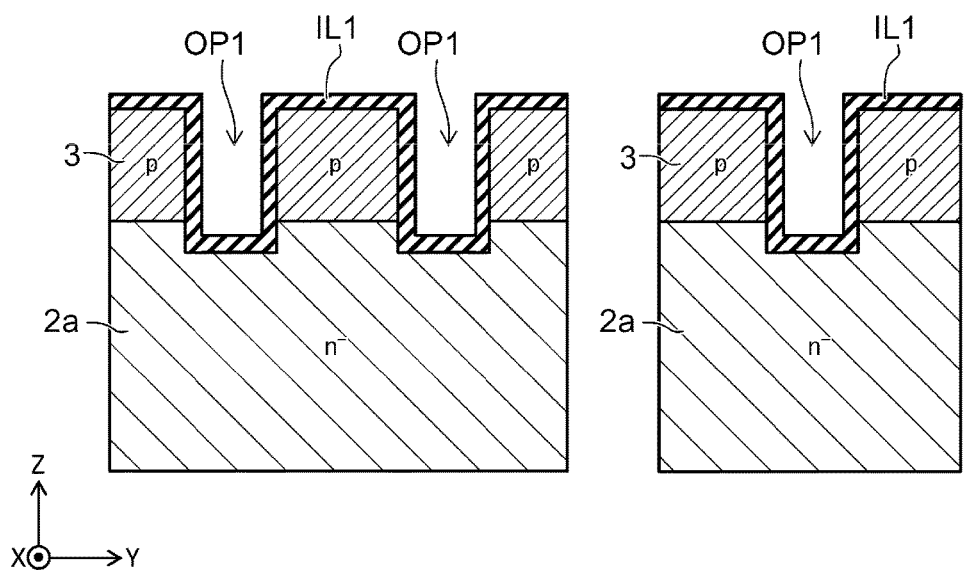
FIGS. 6A and 6B are cross-sectional views illustrating processes in the manufacturing of a semiconductor device according to the first embodiment.
Figure 6B:
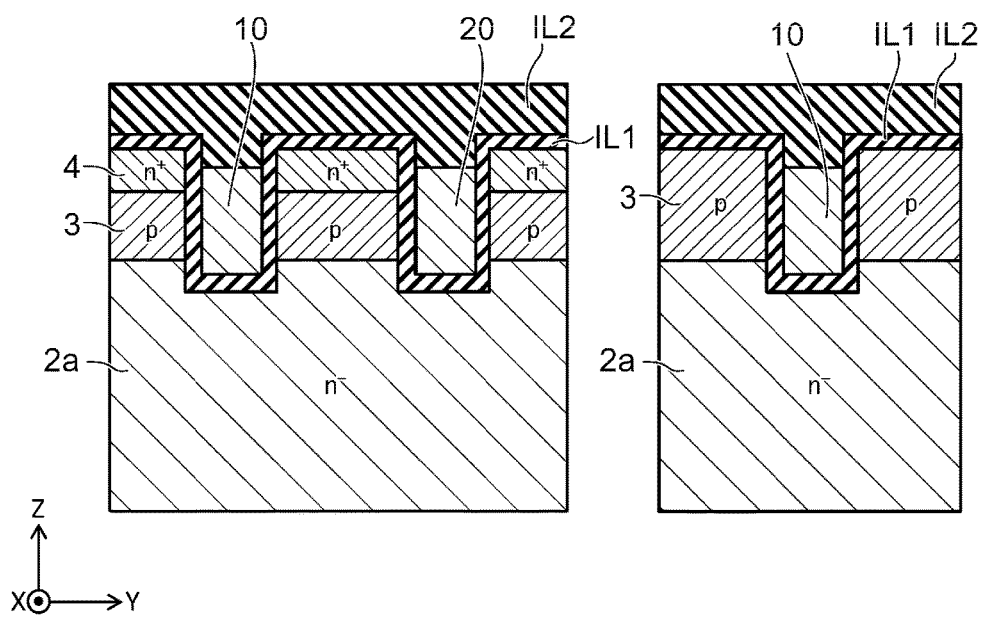

Next, a thermal oxidation process is performed to form an insulating layer IL1 on an inner wall of the openings OP1 and an upper surface of the p-type base region 3 as illustrated in FIG. 6A. A conductive layer is embedded in the openings OP1, and an upper surface of the conductive layer is etched back such that the conductive layer does not completely fill the opening OP1 to the top. According to this process, the gate electrode 10 and the electrode 20 are formed inside the openings OP1. The ion implantation of an n-type impurity and a p-type impurity is sequentially performed with respect to the surface of the p-type base region 3 to form the n$^+$-type emitter region 4 and the p$^+$-type contact region 6. Then, as illustrated in FIG. 6B, an insulating layer IL2, which covers the gate electrode 10 and the electrode 20, is formed.

Figure 7A:
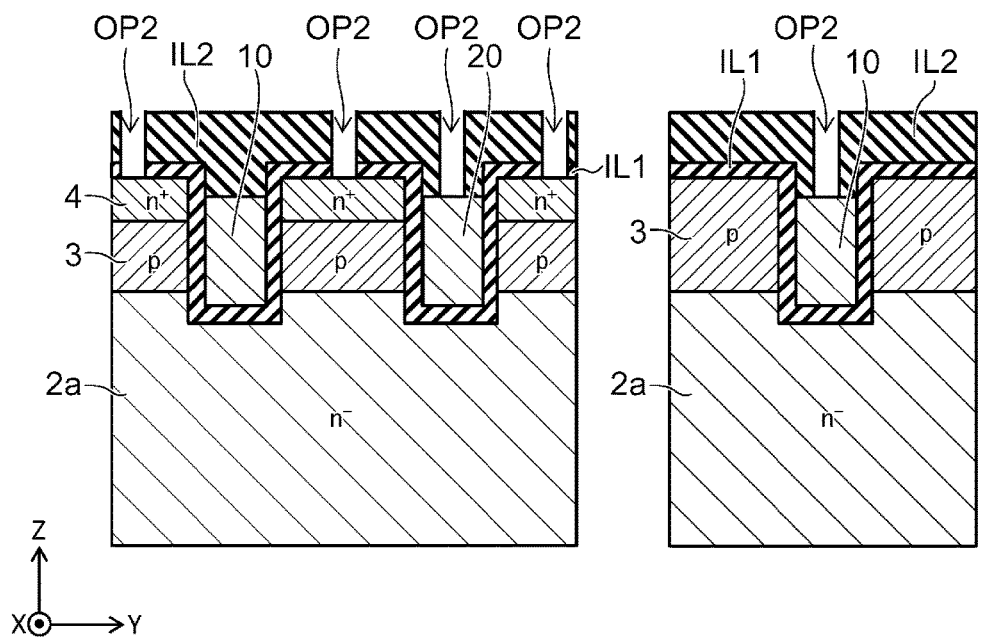
FIGS. 7A and 7B are cross-sectional views illustrating processes of in the manufacturing of the semiconductor device according to the first embodiment.

Next, as illustrated in FIG. 7A, a plurality of openings OP2, which pass through the insulating layers IL1 and IL2, are formed. A portion of the gate electrode 10, a portion of the electrode 20, a portion of the n$^+$-type emitter region 4, and a portion of the p$^+$-type contact region 6 are exposed through by different openings OP2.

Next, the plurality of openings OP2 are filled with a metallic material, and this metallic material may then be etched back. According to this process, the plugs 41 to 43 are formed. A metallic layer is formed on the insulating layer IL2 to cover the plugs 41 to 43. The metallic layer can be patterned to form the emitter pad 52 and the gate pad 53, which are connected to the appropriate plugs.

Next, a rear surface (back-side) of the n⁻-type semiconductor layer 2a is ground (by a grinding or polishing process) until the n⁻-type semiconductor layer 2a has a predetermined thickness.

Figure 7B:
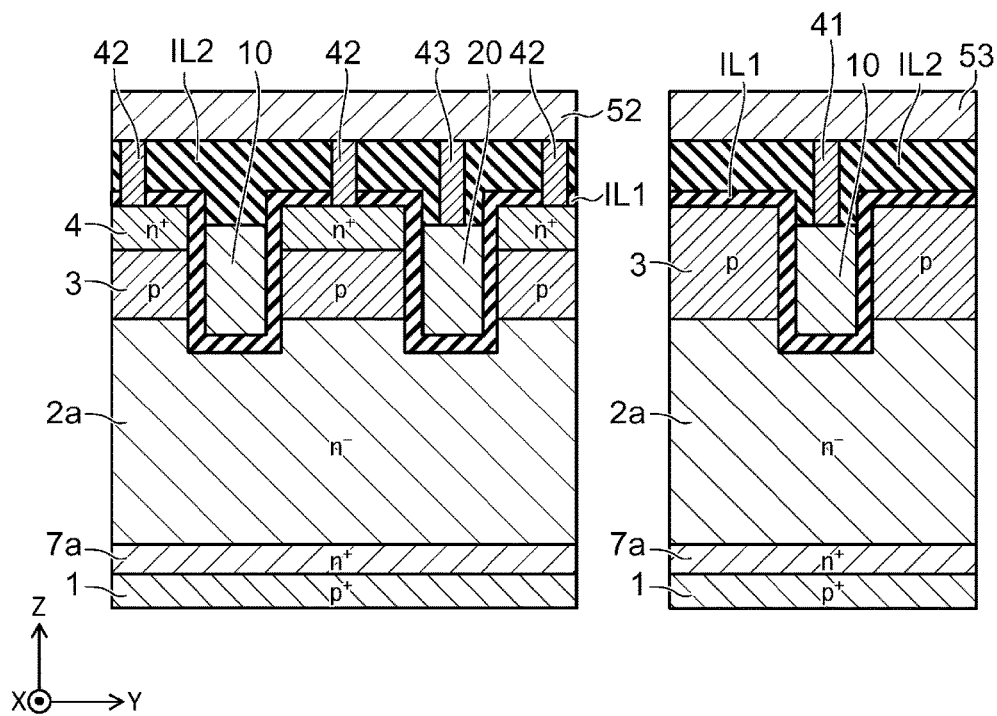

As illustrated in FIG. 7B, ion implantation of an n-type impurity is performed with respect to the rear surface of the n⁻-type semiconductor layer 2a to form an n⁺-type semiconductor layer 7a. Ion implantation of a p-type impurity is performed with respect to the n⁺-type semiconductor layer 7a to form the p⁺-type collector region 1. The collector electrode 51 is formed below the p⁺-type collector region 1. Then, the semiconductor substrate is diced into semiconductor chips having, for example, a size of 10 mm square. According to this, the semiconductor device 100 illustrated in FIG. 1 to FIG. 5 can be obtained.

Here, an operation and an effect of this example embodiment will be described.

In an IGBT, a current which flows through the inside of the semiconductor device in an on-state is large. It is typically necessary to increase the size of the semiconductor device and the number of the gate electrodes so as account for a large current. When breakdown of a gate insulation layer or the like occurs in any one of the large number of gate electrodes, the semiconductor device may not operate normally.

Therefore, in an IGBT in which the number of the gate electrodes included in the semiconductor device is relatively large, it is required that breakdown of the gate insulation layer be unlikely to occur, and for reliability of the gate electrodes to be high.

In this regard, the gate electrode 10 includes the first electrode portion 11 and the second electrode portion 12, and the third electrode portion 13 and the fourth electrode portion 14 are connected to ends of the first electrode portion 11 and the second electrode portion 12 in the X direction between the ends. When employing this configuration, electric field concentration at the ends of the first electrode portion 11 and the second electrode portion 12 is further mitigated in comparison to a case where the first electrode portion 11 and the second electrode portion 12 are independently provided (that is, without connection to third electrode portion 13 or fourth electrode portion 14), and thus it is possible to improve the reliability of the gate electrode 10.

In addition, when the gate electrode 10 includes the third electrode portion 13 and is thus provided in an annular shape, it is possible to further suppress occurrence of an electric potential in the gate insulation layer 18 at the ends of the electrode portions in comparison to a case where the first electrode portion 11 and the second electrode portion 12 are independently provided.

With regard to the gate electrode 10 including the third electrode portion 13 and the fourth electrode portion 14, when connecting the gate electrode 10 to the gate pad 53, for example, it is typical for a portion of the third electrode portion 13 and a portion of the fourth electrode portion 14 to be electrically connected to the gate pad 53 by a via or a contact disposed directly on the third electrode portion 13 or the fourth electrode portion 14. That is, these portions are "pulled up" to an upper surface of the n⁻-type semiconductor region 2, and these "pulled-up" portions are ultimately connected to the gate pad 53.

However, when the third electrode portion 13 or fourth electrode portion 14 are connected to the gate pad 53 in this manner, there is a high possibility of breakdown of the gate insulation layer 18 at the third electrode portion 13 and the fourth electrode portion 14, and this has been verified by the present inventors. It would seem that the likelihood of breakdown is increased because the third electrode portion 13 and the fourth electrode portion 14 are bent at the pulled-up portion. Accordingly, when applying a gate voltage, electric field concentration occurs at the bent portions.

With regard to the problem, in the semiconductor device according to this embodiment, the connection between the gate electrode 10 and the gate pad 53 is performed by the plug 41. When using the plug 41, it is possible to connect the gate electrode 10 and the gate pad 53 without pulling up the third electrode portion 13 and the fourth electrode portion 14 to the upper surface of the n⁻-type semiconductor region 2. According to this, a possibility of breakdown of the gate insulation layer 18 at the third electrode portion 13 and the fourth electrode portion 14 is reduced, and thus it is possible to enhance the reliability of the gate electrode 10.

However, it can be seen empirically that use of only the above-described structure would not be sufficient from the standpoint of the reliability of a gate electrode which is required for use in an IGBT. That is, even when employing the gate electrode 10 including the third electrode portion 13 and the fourth electrode portion 14, and the plug 41, it can be seen that insulation breakdown in the gate insulation layer 18 occurs too frequently.

Particularly, it has been confirmed that the problem becomes more significant when the gate electrode 10 includes polysilicon, and when a gap between the first electrode portion 11 and the second electrode portion 12 becomes narrower. The reason for this is considered as follows. As the gap becomes narrower, a curvature at the third electrode portion 13 and the fourth electrode portion 14 increases, and when applying a gate voltage, electric field concentration at the third electrode portion 13 and the fourth electrode portion 14 is more likely to occur.

With regard to the problem, an investigation and an experiment were performed and the following was found. When connecting the plug 41 to the gate electrode 10, if the plug 41 is connected to the first electrode portion 11 and the second electrode portion 12 which extend in a predetermined direction instead of the third electrode portion 13 and the fourth electrode portion 14 which are curved, it is possible to further improve the reliability of the gate electrode 10.

Through verification with respect to the semiconductor device which includes the gate electrode 10 including the third electrode portion 13 and the fourth electrode portion 14, and in which the plug 41 is connected to the first electrode portion 11 and the second electrode portion 12, it is confirmed that the reliability of the gate electrode, which is required for the IGBT, is improved.

As described above, it is possible to improve the breakdown voltage of the semiconductor device, and it is possible to improve the reliability of the gate electrode by adoption of the configuration of the first embodiment.

It should be noted that the shapes of the third electrode portion 13 and the fourth electrode portion 14 are not limited to the shapes illustrated in FIG. 3 and these portions do not necessarily need to be semicircular.

Figure 8A:
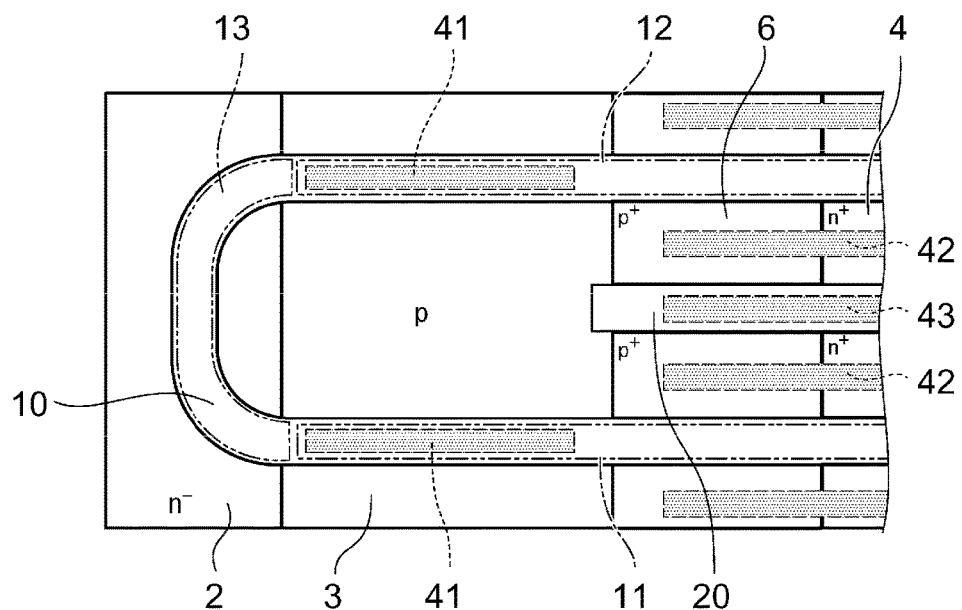
FIGS. 8A and 8B are partially enlarged plan views of the semiconductor device according to the first embodiment.
Figure 8B:
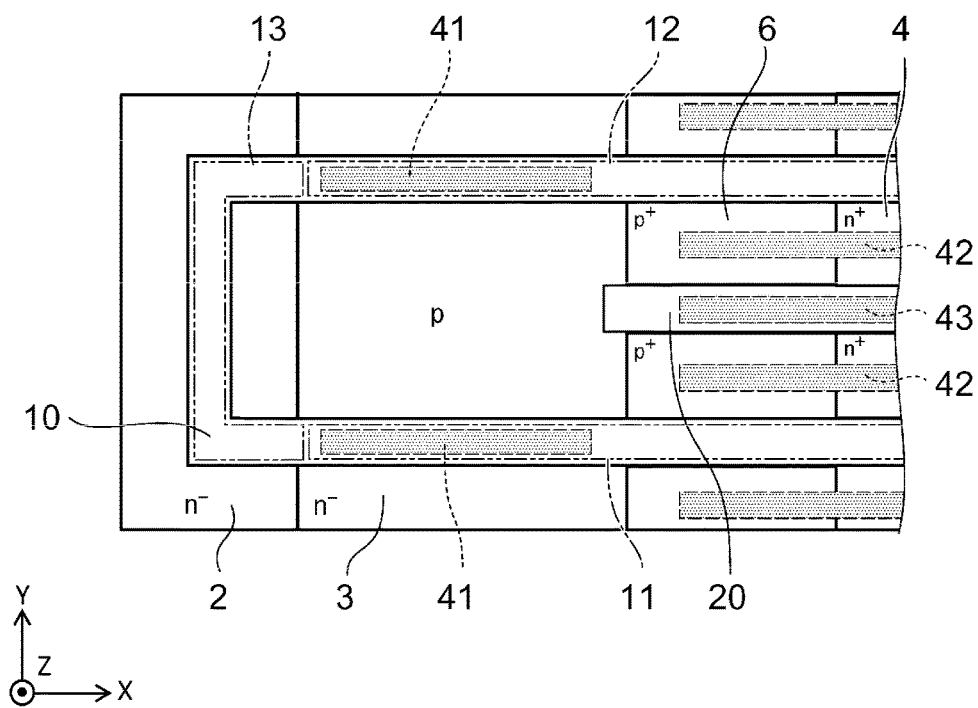

FIGS. 8A and 8B are partially enlarged plan views of the semiconductor device 100 according to the first embodiment having a variation is shape of the third electrode portion 13 and the fourth electrode portion 14.

In FIGS. 8A and 8B, the plugs 41 to 43 are indicated by a broken line.

As illustrated in FIG. 8A, the third electrode portion 13 may include a linear portion and curved portions such that the curvature of the curved portions may be greater than depicted in the example illustrated in FIG. 3.

Alternatively, as illustrated in FIG. 8B, a portion of the third electrode portion 13 may be bent at a sharp angle and thus may include corner portions.

Here, description is given with reference to the third electrode portion 13 as an example. However, the fourth electrode portion 14 may be similarly formed in the variations of third electrode portion 13 depicted in FIGS. 8A and 8B.

When at least a portion of the third electrode portion 13 and the fourth electrode portion 14 is curved it is possible to further mitigate electric field concentration at a curved portion in comparison to a case where a portion of the electrode portions is sharply bent.

Particularly, as illustrated in FIG. 3, it is more preferable that the third electrode portion 13 and the fourth electrode portion 14 are curved with a gentle curvature (large radius of curvature). Specifically, it is preferable that a radius of curvature of the curved portion of the third electrode portion 13 and the fourth electrode portion 14 is 0.25 times to 0.50 times a distance D1 (illustrated in FIG. 3) in the Y direction between a center of the first electrode portion 11 in the Y direction and a center of the second electrode portion 12 in the Y direction. The reason for the preference is as follows. As the curvature is gentle, it is possible to mitigate electric field concentration at the third electrode portion 13 and the fourth electrode portion 14.

Modification Example

Figure 9:
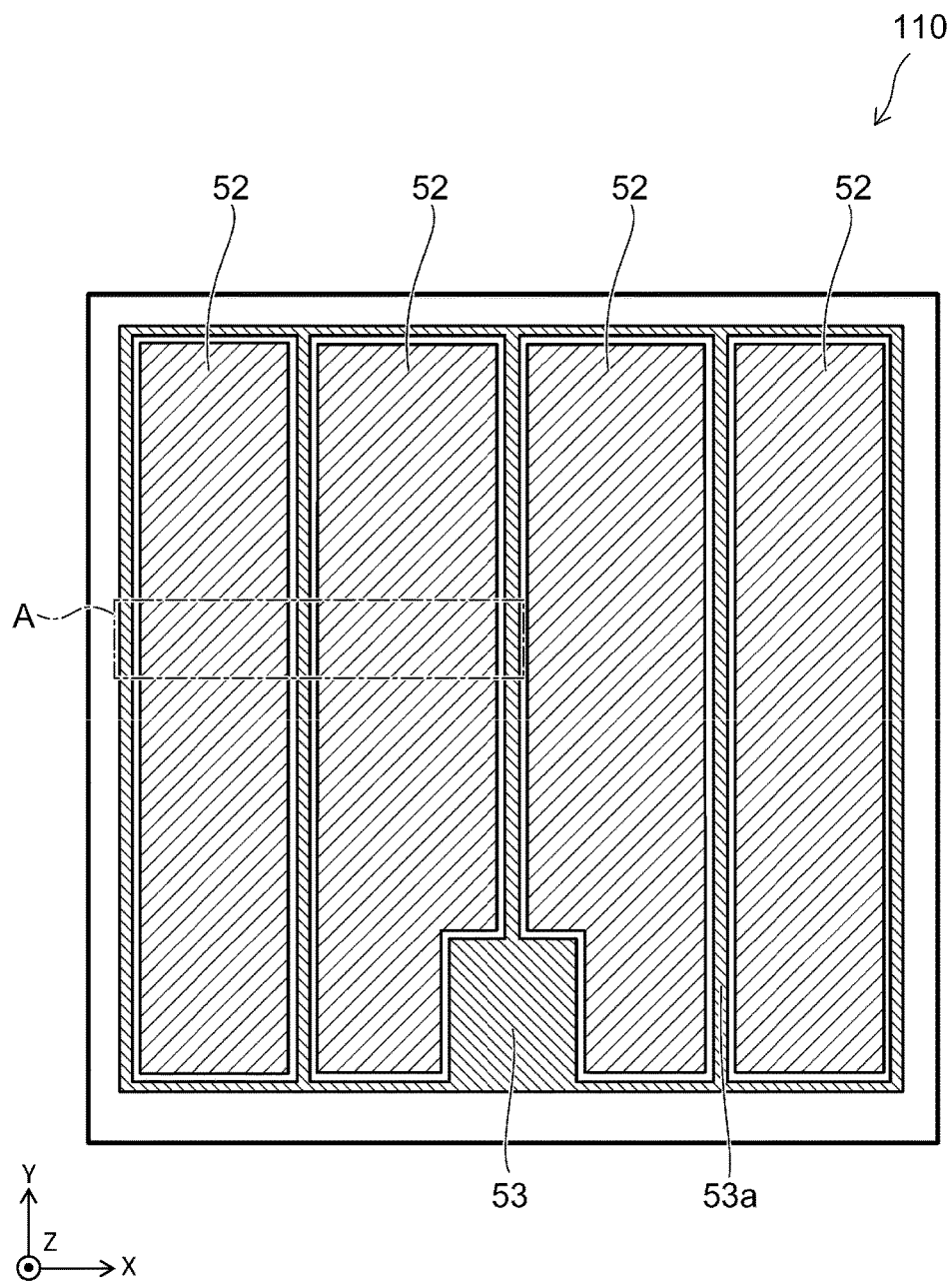
FIG. 9 is a plan view of a semiconductor device according to a modification example of the first embodiment.

FIG. 9 is a plan view of a semiconductor device 110 according to a modification example of the first embodiment.

Figure 10:
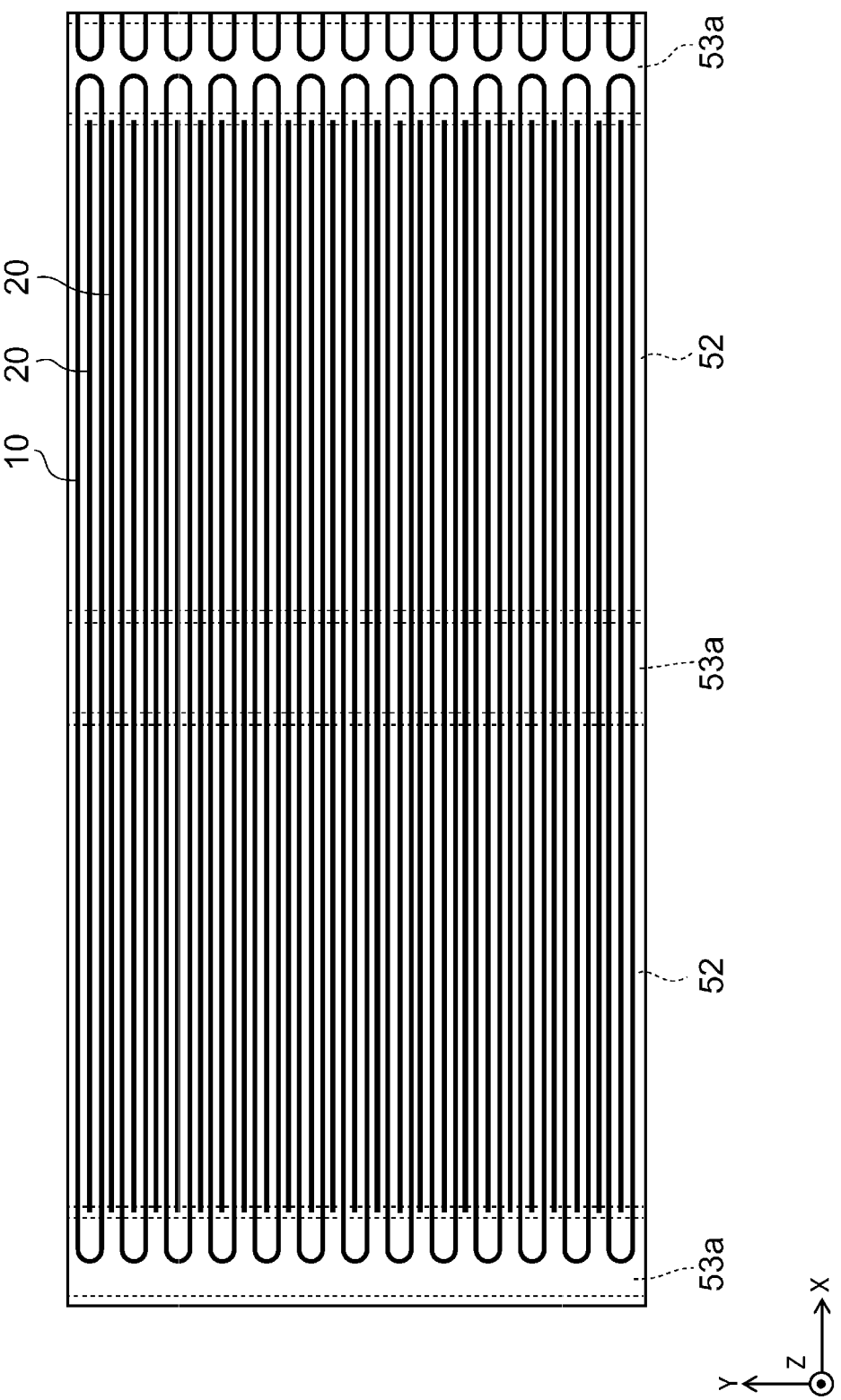
FIG. 10 is an enlarged plan view of a portion A in FIG. 9.

FIG. 10 is an enlarged plan view of a portion A in FIG. 9.

Furthermore, in FIG. 10, the emitter pad 52 and an extension portion 53a of the gate pad 53 are indicated by a broken line.

As illustrated in FIG. 9, the semiconductor device 110 is different from the semiconductor device 100 in the number of the emitter pads 52, and the shape of the gate pad 53.

In addition, as illustrated in FIG. 10, in the semiconductor device 110, each of the gate electrodes 10 and each of the electrodes 20 extend in the X direction on a lower side of a plurality of the emitter pads 52.

The plugs 42 and 43 (not specifically illustrated in FIG. 10) are provided below the emitter pad 52, and are connected to the electrodes 20 and the respective semiconductor regions. In addition, the plug 41 (not specifically illustrated in FIG. 10) is provided below the gate pad 53, and is connected to the gate electrode 10.

Even in the structure of the semiconductor device 110 according to this modification example, as is the case with the semiconductor device 100 according to the first embodiment, it is possible to improve the reliability of the gate electrode while improving the breakdown voltage of the semiconductor device.

In addition, in the semiconductor device 100, the gate electrode 10 extends on a lower side of one of the emitter pads 52 in the X direction. In contrast, in this modification example, the gate electrode 10 extends on a lower side of the plurality of emitter pads 52 in the X direction. According to this, it is possible to further reduce a gap between the gate electrodes 10 in the X direction in comparison to the semiconductor device 100. Accordingly, according to this modification example, it is possible to realize a further increase in an effective area of the semiconductor device or a further reduction in a size of the semiconductor device in comparison to the semiconductor device 100.

Second Embodiment

Next, description will be given of an example of a semiconductor device according to a second embodiment with reference to FIG. 11 to FIG. 13.

Figure 11:
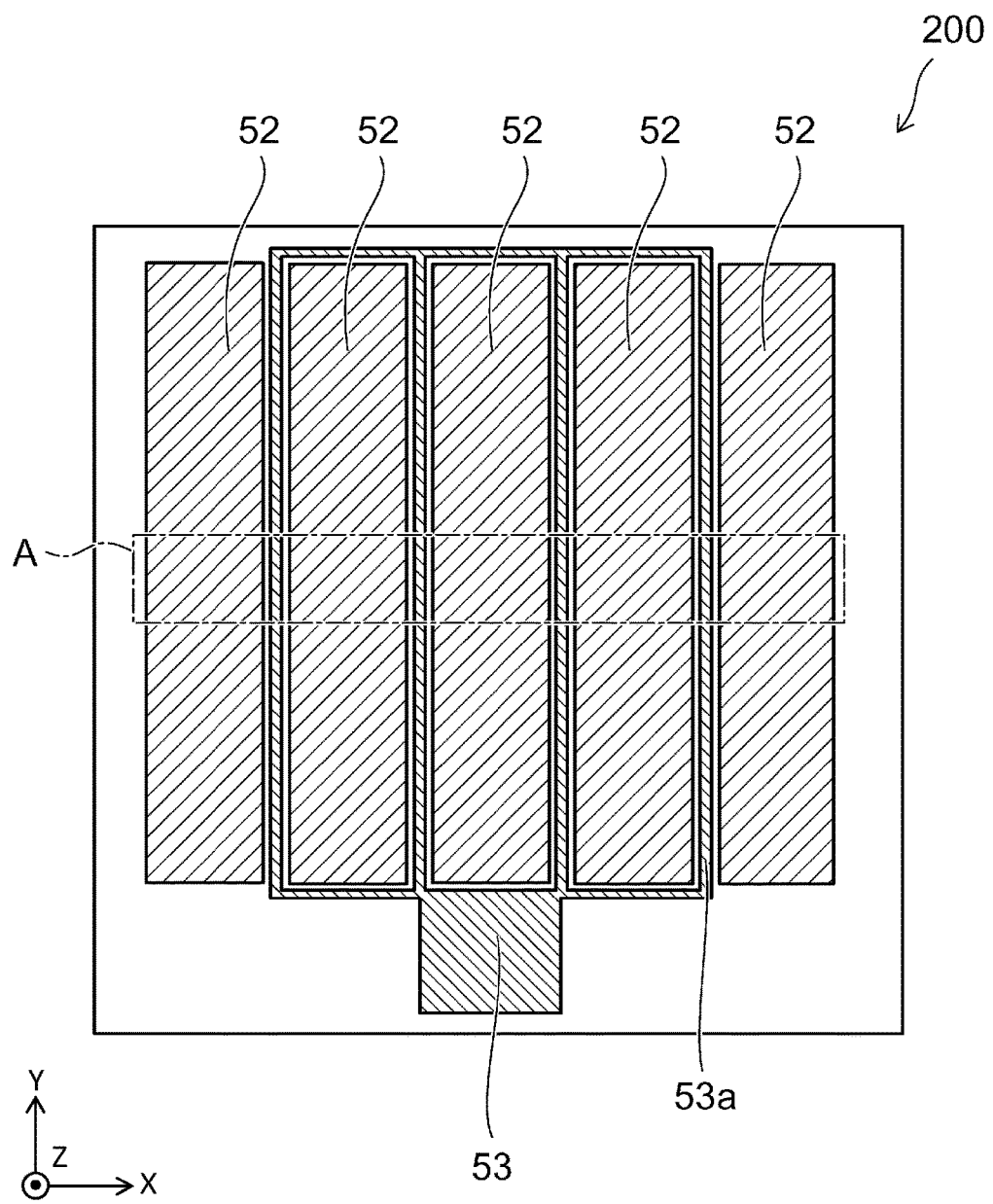
FIG. 11 is a plan view of a semiconductor device according to a second embodiment.

FIG. 11 is a plan view of a semiconductor device 200 according to a second embodiment.

Figure 12:
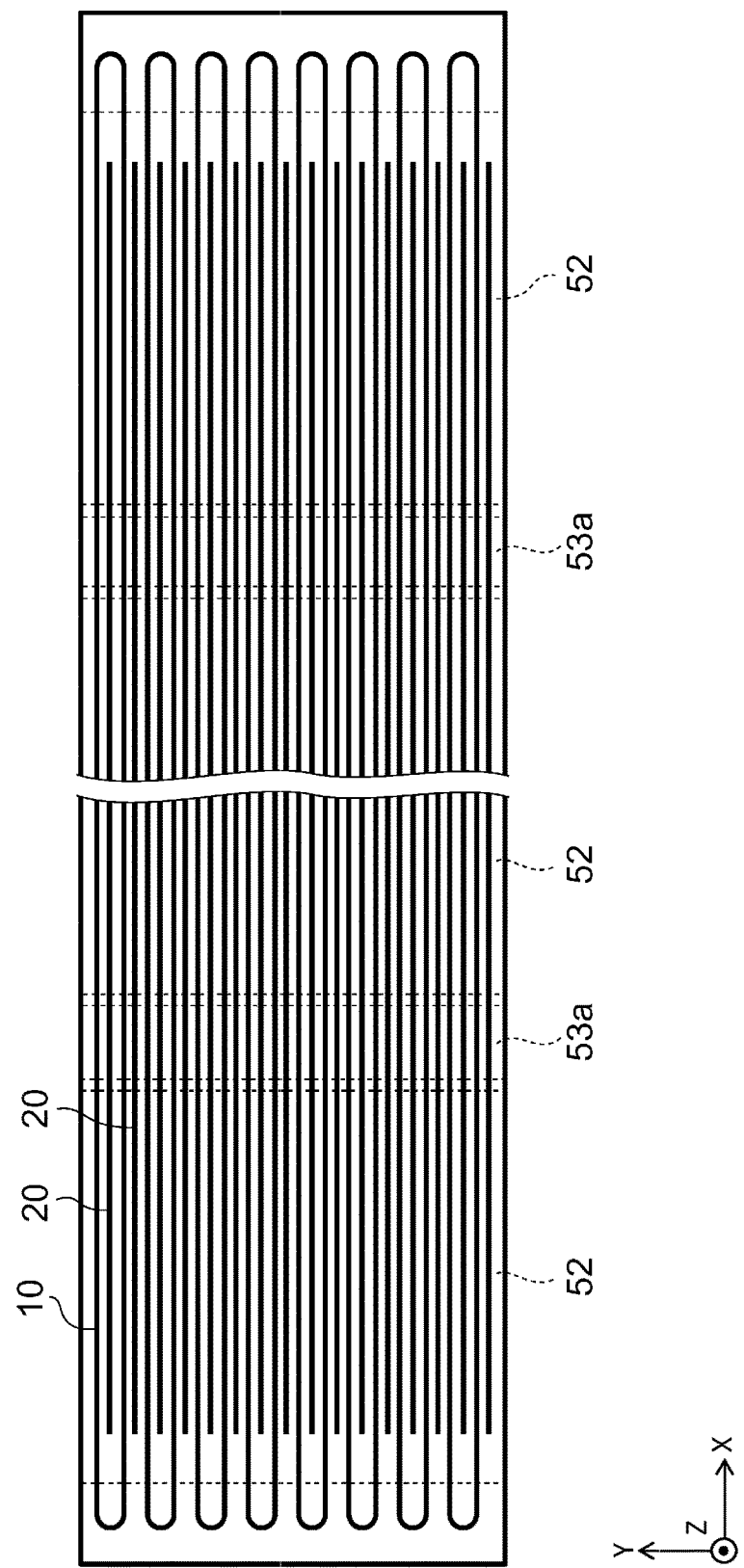
FIG. 12 is an enlarged plan view of a portion A from FIG. 11.

FIG. 12 is an enlarged plan view of a portion A in FIG. 11.

Figure 13:
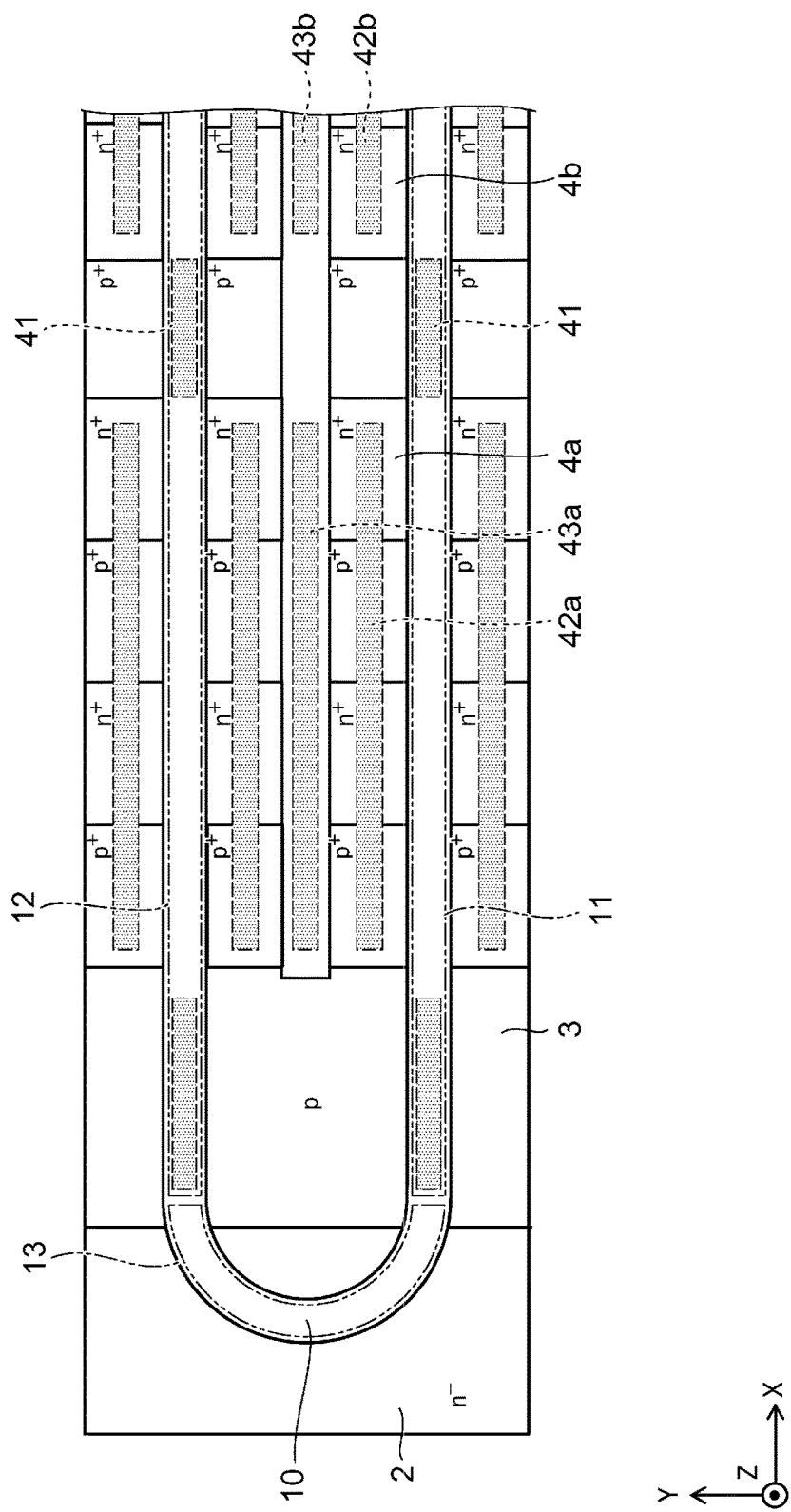
FIG. 13 is a partially enlarged plan view of FIG. 12.

FIG. 13 is a partially enlarged plan view of FIG. 12.

In FIG. 12 the emitter pad 52 and the extension portion 53a of the gate pad 53 are indicated by a broken line. In addition, in FIG. 13, the plugs 41 to 43 are indicated by a broken line.

For example, the semiconductor device 200 according to the second embodiment is different from the semiconductor device 100 in an arrangement and a shape of the emitter pad 52 and the gate pad 53. According to this, an arrangement and a shape of the plugs 41 to 43, which are provided in correspondence with the emitter pad 52 and the gate pad 53, are different from those in the semiconductor device 100.

As illustrated in FIG. 11, a plurality of the emitter pads 52 are provided spaced along the X direction. In addition, the gate pad 53 includes a plurality of the extension portions 53a which extend in the Y direction. Each of the extension portions 53a is provided between the emitter pads 52 in the X direction.

That is, in the X direction, at least a portion of the gate pad 53 (first electrode) is located between a first emitter pad 52 (second electrode) and a second emitter pad 52 (third electrode) that is adjacent to the first emitter pad 52.

In the semiconductor device 100, the plurality of gate electrodes 10 and the plurality of electrodes 20 are provided spaced along the X direction. In contrast, in the semiconductor device 200, as illustrated in FIG. 12, each of the gate electrodes 10 and each of the electrodes 20 extend in the X direction on a lower side of the plurality of emitter pads 52 and the plurality of extension portions 53a. The gate electrodes 10 are connected to the plurality of extension portions 53a through the plug 41 (not specifically illustrated in FIG. 12). In addition, the electrodes 20 are connected to the plurality of emitter pads 52 through the plug 42 or 43 (not specifically illustrated in FIG. 12).

Due to the above-described structure of the pads, in the semiconductor device 200, a position of the plug 41 in the X direction is located between (in the X direction) positions of plugs 42, which are adjacent to each other in the X direction.

As a specific example, as illustrated in FIG. 13, the position of the plug 41 (first conductive portion) in the X direction is located between a position of a plug 42a (second conductive portion) provided on an $n^+$-type emitter region 4a (fourth semiconductor region) in the X direction, and a position of another plug 42b (third conductive portion) provided on an $n^+$-type emitter region 4b (fifth semiconductor region) in the X direction. Furthermore, the $n^+$-type emitter region 4b is spaced away from the $n^+$-type emitter region 4a in the X direction.

Similarly, the position of the plug 41 in the X direction is located between a position of a plug 43a in the X direction and a position of a plug 43b in the X direction. The plug 43b is spaced away from the plug 43a in the X direction.

In addition, according to the shape and the arrangement of the emitter pads 52 and the gate pad 53, as illustrated in FIG. 13, the plug 41 is connected to the first electrode portion 11 and the second electrode portion 12 at a position not at the ends of the electrode portions 11 and 12 nearest the third electrode portion 13 in the X direction.

Furthermore, in the example illustrated in FIG. 13, the plugs 42 and 43 are provided to extend in the X direction, but a plurality of the plugs 42 and a plurality of the plugs 43 may be provided to be arranged along the X direction.

As described above, the present inventors obtained the following finding. Specifically, when the plug 41 is connected to the first electrode portion 11 and the second electrode portion 12 at a position away from ends of the electrode portions 11 and 12 nearest the third electrode portion 13, breakdown is less likely to occur in comparison to a case where the plug 41 is connected to ends of the electrode portions 11 and 12 nearest the third electrode portion 13, and thus it is possible to improve the reliability of the gate electrode 10.

That is, according to this second embodiment, it is possible to further improve the reliability of the gate electrode in comparison to the first embodiment.

In addition, in the semiconductor device according to this second embodiment, the gate electrodes 10 extend in the X direction, and are connected to the plurality of extension portions 53a of the gate pad 53. When employing this structure, it is possible to further reduce a width (dimension in the X direction) of each of the extension portions 53a in comparison to a case, illustrated in FIG. 2, where the plurality of gate electrodes 10 are connected to one extension portion 53a in the X direction. According to this second embodiment, it is possible to realize a further increase in an effective area of the semiconductor device or a further reduction in a size of the semiconductor device in comparison to the first embodiment.

It should be noted that the number of the emitter pads 52 and the number of the extension portions of the gate pad 53 are in general arbitrary, and are not limited to the example illustrated in FIG. 11 to FIG. 13. For example, a greater number of emitter pads 52 and a greater number of extension portions may be alternately provided in the X direction in comparison to the example illustrated in FIG. 11.

Modification Example

Description will be given of an example of a semiconductor device according to modification example of the second embodiment with reference to FIG. 14 and FIG. 15.

Figure 14:
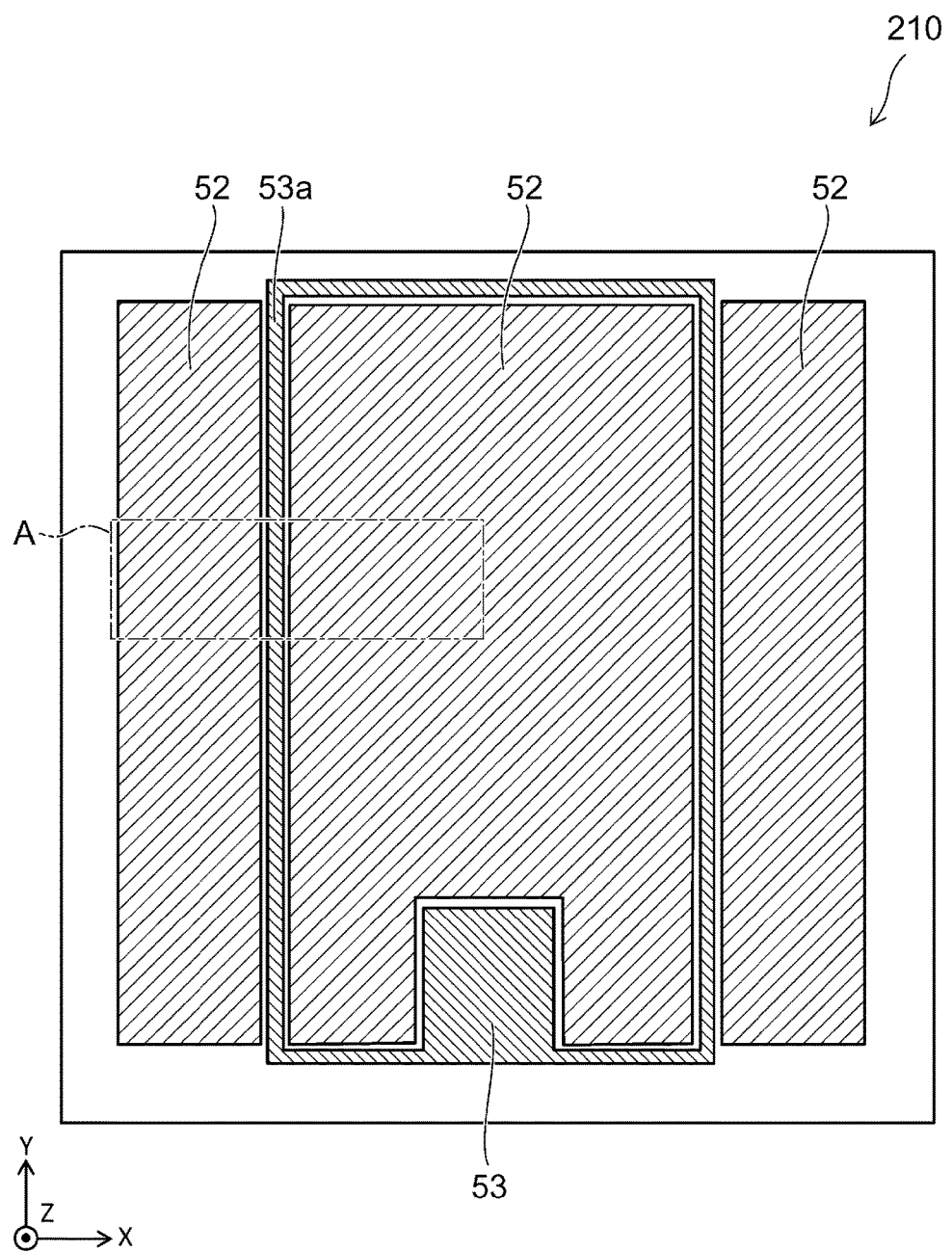
FIG. 14 is a plan view of a semiconductor device according to a modification example of the second embodiment.

FIG. 14 is a plan view of a semiconductor device 210 according to the modification example of the second embodiment.

Figure 15:
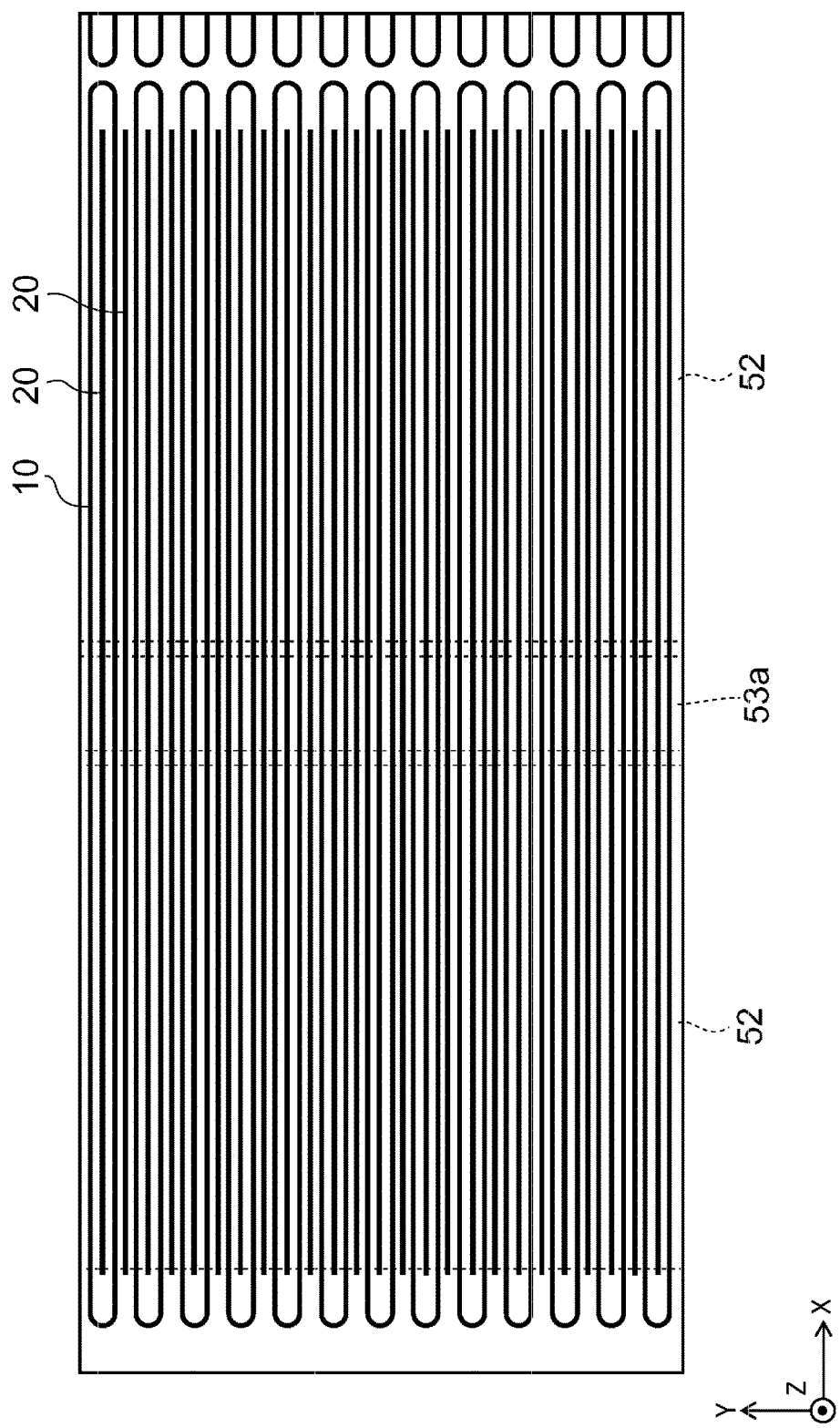
FIG. 15 is an enlarged plan view of a portion A from FIG. 14.

FIG. 15 is an enlarged plan view of a portion A in FIG. 14.

In FIG. 15, the emitter pad 52 and the extension portion 53a of the gate pad 53 are indicated by a broken line.

As illustrated in FIG. 14, a plurality of the emitter pad 52 are provided in the X direction. The gate pad 53 includes two extension portions 53a which extend in the Y direction, and each of the extension portions 53a is between the emitter pads 52 in the X direction.

In the semiconductor device 210, as illustrated in FIG. 15, each of the gate electrodes 10 and each of the electrodes 20 extend in the X direction on a lower side of the plurality of emitter pads 52 and one of the extension portions 53a. The plugs 42 and 43 (not specifically illustrated in FIG. 15) are provided below the emitter pads 52, and are connected to the gate electrode 10 and each of the semiconductor regions. In addition, the plug 41 (not specifically illustrated in FIG. 15) is provided below the extension portion 53a, and is connected to the gate electrode 10. That is, the gate electrode 10 is connected to the gate pad 53 through the plug 41 at an approximately center position along the X direction.

Even in the semiconductor device 210 according to this modification example, as is the case with the semiconductor device 200, the plug 41 is connected to the first electrode portion 11 and the second electrode portion 12 at a position away from ends of the electrode portions 11 and 12. According to this, it is possible to further improve the reliability of the gate electrode while improving the breakdown voltage of the semiconductor device in comparison to the first embodiment.

In FIG. 14 and FIG. 15, description is given to a case where two sets of the gate electrodes 10 and the electrodes 20 are provided in the X direction, but the number of sets of the electrodes in the X direction is arbitrary. In addition, the shape and the arrangement of the plugs 41 to 43, the emitter pads 52, and the gate pad 53 can be appropriately changed in accordance with the shape and the arrangement of the gate electrodes 10 and the electrodes 20.

In the above-described embodiments, a relative magnitude of an impurity concentration between the respective semiconductor regions can be confirmed by using a scanning electrostatic capacity microscope (SCM). Furthermore, a carrier concentration in the respective semiconductor regions can be regarded as the same thing as the concentration of impurities which are activated in the respective semiconductor regions. Accordingly, a relative magnitude of the carrier concentration between the respective semiconductor regions can also be confirmed by using the SCM.

In addition, for example, the impurity concentration in the respective semiconductor regions can be measured by a secondary ion mass spectrometry (SIMS).

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the inventions. For example, with regard to specific configurations of respective elements such as the $p^+$-type collector region 1, the $n^+$-type semiconductor region 7, the $n^-$-type semiconductor region 2, the p-type base region 3, the $n^+$-type emitter region 4, the $p^+$-type contact region 6, the gate electrode 10, the gate insulation layer 18, the electrode 20, the insulating layer 28, the insulating layer 30, the collector electrode 51, the emitter pad 52, and the gate pad 53, which are included in the embodiments, may be appropriately selected from a known technology by those skilled in the art. The accompanying claims and their equivalents are intended to cover such forms and modifications as would fall within the scope and spirit of the present disclosure.

What is claimed is:

1. A semiconductor device, comprising:
   a first semiconductor region of a first conductivity type;
   a second semiconductor region of a second conductivity type on the first semiconductor region;
   a third semiconductor region of the first conductivity type on the second semiconductor region such that the second semiconductor region is between first and third region in a first direction;
   a plurality of gate electrodes on the second semiconductor region and extending through the third semiconductor region in the first direction, the plurality of gate electrodes extending in a second direction and spaced from each other in a third direction, the second and third directions crossing each other and being parallel to a plane of the first semiconductor region, the first direction extending away from the plane;

a fourth semiconductor region of the second conductivity type on the third semiconductor region, a concentration of second conductivity type impurities in the fourth semiconductor region being greater than a concentration of second conductivity type impurities in the second semiconductor region;

a fifth semiconductor region of the first conductivity type on the third semiconductor region and adjacent to the fourth semiconductor region in the second direction, a concentration of first conductivity type impurities in the fifth semiconductor region being greater than a concentration of first conductivity type impurities in the third semiconductor region, wherein each gate electrode includes:
 a first portion extending in the second direction from a first end to a second end;
 a second portion extending in the second direction from a first end to a second end, the first and second portions being spaced from each other in the third direction; and
 a third portion extending in the first direction and connecting the first end of the first portion to the first end of the second portion, the third portion being in a portion of the second semiconductor region, the first and second portions being in the third, fourth, and fifth semiconductor regions;

a first insulating film on the plurality of gate electrodes and the second, third, fourth, and fifth semiconductor region;

a first interconnect portion disposed on the first or second portion of at least one gate electrode in the plurality of gate electrodes, extending in the first direction through the first insulating film to electrically connecting the gate electrode to a gate pad; and a second interconnect portion disposed on the fourth and fifth semiconductor regions, extending in the first direction through the first insulating film, and electrically connecting the fourth and fifth semiconductor regions to an emitter pad.

2. The semiconductor device according to claim 1, wherein the third portion of at least one gate electrode in the plurality of gate electrodes is curved.

3. The semiconductor device according to claim 2, wherein a radius of curvature of the third portion is 0.25 times to 0.50 times a distance in the third direction from a center of the first portion of the at least one gate electrode to a center of the second portion of the at least one gate electrode.

4. The semiconductor device according to claim 1, wherein the third portion of at least one gate electrode in the plurality of gate electrodes comprises a first curved portion adjacent to the first portion of the at least one gate electrode, a second curved portion adjacent to the second portion of the at least one gate electrode, and a first linear portion extending in the third direction and connecting the first and second curved portions to each other.

5. The semiconductor device according to claim 1, wherein the third portion of at least one gate electrode in the plurality of gate electrodes includes a linear portion extending along the third direction.

6. The semiconductor device according to claim 1, wherein the first insulating film includes a portion that is disposed between each gate electrode in the plurality of gate electrodes and the second and third semiconductor regions.

7. The semiconductor device according to claim 1, wherein the gate pad and the emitter pad are disposed on the first insulating film.

8. The semiconductor device according to claim 1, wherein
 the emitter pad is provided in a plurality of portions spaced from each other in the second direction,
 the gate pad includes a plurality of extension portions connected to a pad portion, and
 at least one portion in the plurality of portions of the emitter pad is disposed between adjacent extension portions of the gate pad in the second direction.

9. The semiconductor device according to claim 8, wherein
 the plurality of gate electrodes extend in the second direction from a first position that is below, in the first direction, a first portion in the plurality of portions of the emitter pad to a second position that is below, in the first direction, a second portion in the plurality of portions of the emitter pad,
 a one of the plurality of extension portions of the gate pad is disposed between the first and second portions of the emitter pad in second direction, and
 the first interconnect portion is disposed between the first and second positions along the second direction and directly connected to the one of the plurality of extension portions of the gate pad.

10. The semiconductor device according to claim 9, wherein a position along the second direction of the first interconnect portion is between a position along the second direction of the second interconnect portion and a position along the second direction of the third interconnect portion.

11. The semiconductor device according to claim 1, further comprising:
 a sixth semiconductor region of the second conductivity type on the third semiconductor region, a concentration of second conductivity type impurities in the sixth semiconductor region being greater than the a concentration of second conductivity type impurities in the second semiconductor region, the sixth semiconductor region being separated from the fourth semiconductor region in the second direction by at least one region of the first conductivity type; and
 a third interconnect portion that is provided disposed on the sixth semiconductor region and extending in the first direction through the first insulating layer, and electrically connecting the sixth semiconductor region to the emitter pad.

12. A semiconductor device, comprising:
 a first semiconductor region of a first conductivity type;
 a second semiconductor region of a second conductivity type on the first semiconductor region;
 a gate electrode disposed in the second semiconductor region on a gate insulation layer between the gate electrode and the second semiconductor region in a first direction, the gate electrode including:
  a first electrode portion that extends in a second direction perpendicular to the first direction,
  a second electrode portion that separated from the first electrode portion in a third direction that crosses the first and second directions, and extends in the second direction, and
  a third electrode portion connected to an end of the first electrode portion in the second direction and an end of the second electrode portion in the second direction;

a third semiconductor region of the first conductivity type provided on the second semiconductor region and between the first and second electrode portions in the third direction;

a fourth semiconductor region of the second conductivity type provided on a portion of the third semiconductor region;

a first insulating layer provided on the fourth semiconductor region and the gate electrode;

a first conductive portion provided on a portion of the first electrode portion and extending through the first insulating layer in the first direction; and a second conductive portion provided on a portion of the fourth semiconductor region and extending through the first insulating layer in the first direction.

13. The semiconductor device according to claim 12, wherein the third electrode portion of the gate electrode is curved.

14. The semiconductor device according to claim 13, wherein a radius of curvature of the third electrode portion is 0.25 times to 0.50 times a distance in the third direction from the first electrode portion to the second portion of the gate electrode.

15. The semiconductor device according to claim 12, further comprising:

a fifth semiconductor region of the second conductivity type provided on the third semiconductor region, and separated from the fourth semiconductor region in the second direction;

a third conductive portion provided on a portion of the fifth semiconductor region and extending through the first insulating layer in the first direction;

a first electrode provided on the first insulating layer, and connected to the first conductive portion;

a second electrode provided on the first insulating layer separated from the first electrode and connected to the second conductive portion; and a third electrode provided on the first insulating layer, separated from the first electrode and the second electrode, and connected to the third conductive portion, wherein at least a portion of the first electrode is located between the second electrode and the third electrode in the second direction.

16. An insulated gate bipolar transistor device, comprising:

a collector electrode disposed on a first side of a first semiconductor layer;

an insulating layer disposed on a second side of the first semiconductor layer, the first and second sides spaced from each other in a first direction;

an emitter electrode pad disposed on the insulating layer and separated from first semiconductor layer in the first direction;

a gate electrode pad disposed on the insulating layer and separated from the first semiconductor layer in the first direction and separated from the from the emitter electrode pad in a second direction crossing the first direction;

a plurality gate electrodes disposed via a gate insulating film on the first semiconductor layer to be between the insulating layer and the collector electrode in the first direction, each gate electrode having an elongated annular shape with the second direction being the long-axis direction, the plurality of gate electrodes separated from each other in a third direction crossing the first and second directions; and a first interconnect between at least one gate electrode and the gate electrode pad in the first direction is disposed on a portion of the at least one gate electrode that is between ends of the at least one gate electrode along the second direction.

17. The insulated gate bipolar transistor device according to claim 16, further comprising:

a first region of a first conductivity type in the first semiconductor layer contacting the collector electrode;

a second region of a second conductivity type in the first semiconductor layer between first region and the plurality of gate electrodes in the first direction;

a third region of the first conductivity type in the first semiconductor layer between the second region and the insulating layer in the first direction and between adjacent gate electrodes in the plurality of gate electrodes in the third direction;

a fourth region of the second conductivity type in first semiconductor layer between the third region and the insulating layer in the first direction and between adjacent gate electrodes in the plurality of gate electrodes in the third direction, a concentration of second conductivity type impurities in the fourth region being greater than a concentration of second conductivity type impurities in the second region; and a fifth region of the first conductivity type between the third region and the insulating layer in the first direction and between adjacent gate electrodes in the plurality of gate electrodes in the third direction, the fifth region being adjacent to the fourth region in the second direction, a concentration of first conductivity type impurities in the fifth region being greater than a concentration of first conductivity type impurities in the third region.

18. The insulated gate bipolar transistor device according to claim 16, at least one gate electrode in the plurality of gate electrodes has an end portion that has a semicircular shape.

19. The insulated gate bipolar transistor device according to claim 16, wherein at least one gate electrode in the plurality of gate electrodes has an end portion having a radius of curvature that is 0.25 times to 0.50 times a spacing distance in the third direction between opposed linear portion of the at least one gate electrode.

20. The insulated gate bipolar transistor device according to claim 16, further comprising:

a second interconnect between the emitter electrode pad and the first semiconductor layer in the first direction; and a third interconnect between the emitter electrode pad and a buried electrode that is disposed in the first semiconductor layer between adjacent gate electrodes in the third direction.

* * * * *